United States Patent [19]

Kellner et al.

[11] 4,292,643
[45] Sep. 29, 1981

[54] HIGH CUT-OFF FREQUENCY PLANAR SCHOTTKY DIODE HAVING A PLURALITY OF FINGER-LIKE PROJECTIONS ARRANGED IN PARALLEL IN A TRANSMISSION LINE

[75] Inventors: Walter Kellner, Putzbrunn; Hermann Kniepkamp, Munich; Dietrich Ristow, Neubiberg, all of Fed. Rep. of Germany

[73] Assignee: Siemens Aktiengesellschaft, Berlin & Munich, Fed. Rep. of Germany

[21] Appl. No.: 62,677

[22] Filed: Aug. 1, 1979

[30] Foreign Application Priority Data

Aug. 25, 1978 [DE] Fed. Rep. of Germany ....... 2837283

[51] Int. Cl.³ .................... H01L 29/48; H01L 29/56; H01L 29/64
[52] U.S. Cl. ........................ 357/15; 357/68; 357/20; 333/247
[58] Field of Search ............... 357/15, 70, 68, 20; 333/247

[56] References Cited

U.S. PATENT DOCUMENTS

| | | | |
|---|---|---|---|
| 3,416,042 | 12/1968 | Thomas et al. | 333/247 |
| 3,432,778 | 3/1969 | Ertel | 333/247 |
| 3,443,169 | 5/1969 | Foxell et al. | 357/15 |
| 3,508,125 | 4/1970 | Ertel | 357/15 |
| 3,534,267 | 10/1970 | Hyltin | 357/15 |
| 3,842,360 | 10/1974 | Dickens | 350/70 |

FOREIGN PATENT DOCUMENTS 52-47381 4/1977 Japan ............... 357/15

OTHER PUBLICATIONS

IEEE Transactions on Microwave Theory and Techniques, vol. MTT-25, No. 6, Jun. 1977, pp. 494-495.
IEEE Transactions on Electron Devices, vol. ED-22, No. 4, Apr. 1975, pp. 198-199.

*Primary Examiner*—Andrew J. James
*Attorney, Agent, or Firm*—Hill, Van Santen, Steadman, Chiara & Simpson

[57] ABSTRACT

A planar Schottky diode is disclosed which is inserted into a transmission line without disruption of characteristic impedance. The diode comprises a plurality of parallel finger-like projections forming Schottky contacts distributed over a width of the transmission line and also of ohmic contacts surrounding these projections but with a longer contact edge.

5 Claims, 4 Drawing Figures

HIGH CUT-OFF FREQUENCY PLANAR SCHOTTKY DIODE HAVING A PLURALITY OF FINGER-LIKE PROJECTIONS ARRANGED IN PARALLEL IN A TRANSMISSION LINE

BACKGROUND OF THE INVENTION

The invention relates to a planar Schottky diode with a high limit or cut-off frequency inserted in a transmission line.

A Schottky diode for high cut-off frequency inserted in a transmission line is known from the publication "IEEE Transactions on Microwave Theory and Technique", Vol. MTT25 (1977), pages 494–95, incorporated herein by reference. The Schottky diode described there consists of a single Schottky metal semiconductor contact which is inserted on the substrate body between the leads applied on the surface of the substrate body. When the Schottky diode is inserted into a line with defined characteristic impedance, in higher frequency ranges, it should, if possible, not disrupt the characteristic impedance, for example 50 ohms or 60 ohms, of the line. In this known Schottky diode, the one lead of a band-shape is designed to taper toward the Schottky contact.

A Schottky diode that is designated as an edge diode is known from the publication "IEEE Transactions on Electron Devices", Vol. ED-22 (1975), pages 198–99, incorporated by reference herein. In this known Schottky diode, a Schottky contact extending at right angles to the transmission line is provided which is formed with the end-face surface of an n-doped gallium arsenide layer applied to a substrate.

An edge diode as mentioned above can only be manufactured with relative difficulty in reproducible manner with parameters held within narrow limits. In particular, narrow tolerances for the doping and the doping gradient in the area of the frontface surface of the Schottky contact cause difficulties.

In order to achieve a high cut-off frequency, not only a relatively small capacitance must be achieved for a Schottky diode like the one under discussion here, but, rather, the series and contact resistance occurring in the course of the transmission line must also be held as small as possible.

SUMMARY OF THE INVENTION

It is an object of the invention to specify a Schottky diode with leads and planar format suitable for a high limit or cut-off frequency in which a disruption-free provision of the characteristic impedance of the diode leads is assured.

This object is inventively achieved with a Schottky diode provided in a transmission line wherein a doped semiconductor area provides a Schottky metal-semiconductor contact and wherein the Schottky contact is designed in finger-like fashion and is largely surrounded by an ohmic metal contact, and wherein in order to avoid a disruption of the characteristic impedance of the transmission line a plurality of these Schottky contacts designed in finger-like fashion are arranged parallel to one another across a width of the transmission line and at right angles to the running direction of the transmission line.

In the edge diode known from the above noted publication, a Schottky diode junction is known which extends over the entire width of the strip-shaped transmission line. In the present invention, however, the relationship of the length of the contact edge of the ohmic resistance to the length of the contact edge of the Schottky contact is advantageously significantly greater than 1 and, nonetheless, a transition that is disruption-free with respect to the characteristic impedance from the lead into the diode and out of the diode into the continuing line is achieved.

DESCRIPTION OF THE PREFERRED EMBODIMENTS

Figure 1:
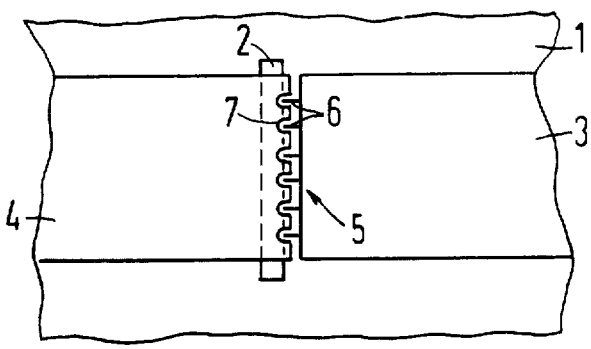
FIG. 1 shows a plan view of a Shottky diode of the invention inserted into a transmission line.

A portion of the surface of a substrate body 1 is illustrated in top view in FIG. 1. This substrate body is an electrically insulating material and, for a Schottky diode like the one of the invention is preferably a body of high-resistance gallium arsenide which is made semi-insulating by means of compensation. A layer-like strip 2 consisting of semiconductor material which is, particularly, n-conductive gallium arsenide, is present on or, respectively, in the surface of the substrate body 1. The lead-in 3 and continuation 4 of the transmission line 3 are provided as a strip-shaped metal layer into which the inventive diode generally shown at 5 is inserted. This diode 5 is formed by the finger-like projections 6 of the line 3 together with the semiconductor material of the strip 2. This metal-semiconductor contact existing between the projections 6 and the semiconductor material of the strip 2 has the known properties of a Schottky diode as a result of the respective doping of the semiconductor material which it is known to select.

The finger-like projections 6—as can be seen from the Figures—are basically arranged over the entire width of the transmission line 3, 4. In the illustration of FIG. 1, only six such projections are illustrated. In the actual embodiment, for example, for a 200 μm wide line 3,4, twenty projections are provided. This corresponds to the technologically practical constructions of such projections 6 which engage into the illustrated recesses or cut-out portions of the oppositely positioned line.

Figure 2:
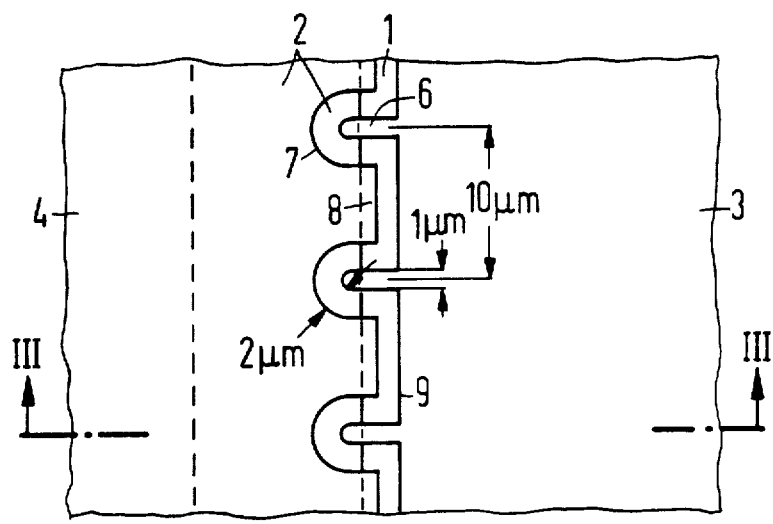
FIG. 2 is an enlarged illustration of the details of the Schottky diode of FIG. 1 that are significant to the invention.

FIG. 2 shows details of the plan view of FIG. 1 which are significant to the invention. In FIG. 2, only a portion of the two parts 3 and 4 of the transmission line are shown so that only very small portions of the surface of the substrate body 1 can be seen between these parts 3 and 4 of the transmission line (in the top view of FIG. 2). The strip 2 of semiconductor material is illustrated for the most part with broken lines. The largest part of the strip 2 is covered by part 4 of the transmission line.

An ohmic contact with the lowest possible resistance exists between the metal of part 4 of the transmission line 3, 4 and the semiconductor material of the strip 2. The semiconductor material of strip 2 exhibits a doping which is to be selected such that not only the Schottky metal-semiconductor contact (between the strip 2 and the respective projection 6) already mentioned exists, but also so that the series resistance between these Schottky contacts and the part 4 of the transmission line is also as small as possible.

Only three of the projections 6 described above are illustrated in FIG. 2. They lie with their front portions on the semiconductor material of the strip 2, as can be seen. These front portions, forming the Schottky contact, are closely surrounded by appropriately designed set-offs or recesses of part 4 of the transmission line. It must be assured, however, that no flashover exists and sufficient puncture strength exists between these projections 6 and the set-off recesses 7. The measurements shown in FIG. 2 are sample embodiments of the invention and add clarification. Given a width of, let us assume, 200 μm of parts 3 and 4 of the transmission line, twenty such projections 6 can be technologically provided and incorporated at intervals of 10 μm. This number guarantees not only the disruption-free course of the characteristic impedance of the line but also assures attainment of a high cut-off frequency in comparison to the prior art as a result of a low capacitance of the junction and low series resistance lying in series with the Schottky contact. The embodiment illustrated is relatively insensitive to a misadjustment since the intervals between the projections 6 and the cut-outs or recesses 7 can be kept relatively large without disadvantage. Values in the range of up to 300 GHz may be specified for the cut-off frequency.

Figure 3:
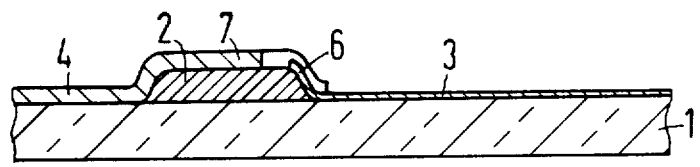
FIG. 3 shows a side view of FIG. 2.

FIG. 3 shows the cross-sectional view along line III—III in FIG. 2. The reference symbols cited agree with those of FIG. 2. The different thickness of the illustrations of parts 3 and 4 of the transmission line is without particular significance, but allows one to see the engagement of the projections 6 into the set-offs or recesses 7 in FIG. 3 as well (in conjunction with the shading of section parts). The areas 8 of the section 4 of the transmission line lying between the set-offs 7 preferably extend beyond the edge of the strip 2 of semiconductor material neighboring part 3 of the transmission line. The interval between areas 8 and edge 9 opposite 8 of part 3 of the transmission line lying opposite and located between projections 6 is dimensioned at 5 μm so that the stray capacitance between parts 3 and 4 becomes sufficiently small.

As already mentioned above, given gallium arsenide for the strip 2, semi-insulating gallium arsenide is preferably employed for the substrate since the material of strip 2 can be particularly well epitaxially deposited thereon. In principle, however, the material of strip 2 can also be epitaxially deposited on an insulating substrate such as sapphire or the like. It is important that the material of strip 2 have faultless semiconductor properties, particularly a disruption-free crystal structure.

Figure 4:
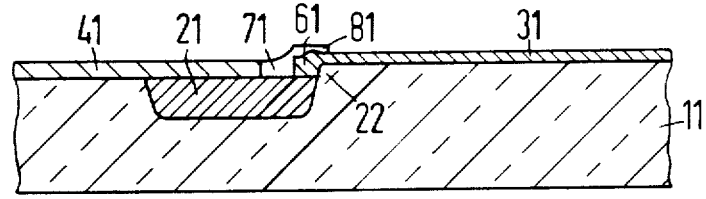
FIG. 4 shows an intermediate stage of a manufacturing process of a diode according to the invention.

Two methods are particularly suited for the manufacture of the Schottky diode of this invention. The one method already proceeds basically from the described Figures in which the semiconductor strip 2 is epitaxially grown on a substrate surface. Parts 3 and 4 are then applied in the layer thickness required for the electric line on the substrate 1 provided with the strip 2, preferably by means of mask vapor depositing. A structure resulting from another manufacturing method is illustrated in FIG. 4. In this embodiment, the strip 21 corresponding to strip 2 with the semiconductor property necessary for a Schottky contact is embedded in the substrate body 11. Such an embedded strip 21 can be generated, for example, by means of doping implantation of the semiconductor material of the substrate body 11. A mask covering the surface of the substrate body 11 is employed for this implantation. Preferably, a step indicated with 22 is provided by means of etching away the substrate body 11 after an appropriate masking of the substrate surface. This step is an identification of the location at which the Schottky diode is to be manufactured on or in the substrate body 11, this location being provided for further processes to be carried out with masks. The portion of the transmission line corresponding to part 3 is referenced 31. The projections 61 of this part 31 are designed as in the example of FIGS. 1 through 3 and overlap up to the semiconductor material of strip 21. The projections 61 project into the cut-outs 71 of the other part 41 of the transmission line and the edge 81 of the part 41 already lies on the unaltered surface of the substrate body 11. The electric contact between the part 41 and the strip 21 has ohmic character with the lowest possible contact resistance. Preferred dimensions of this sample embodiment are identical to those of the sample embodiment described above.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A planar Schottky diode for high cut-off frequency, comprising: a substrate; a conductive transmission line having first and second parts arranged on the substrate; a doped semiconductor area positioned between a portion of the transmission line and portions of the substrate; a Schottky contact comprising finger-like extensions of the first part of the transmission line extending into a recess of the second part of the transmission line such that said second part partially surrounds on ohmic metal contact created between the finger-like portion and the doped semiconductor area on which the finger-like portion lies and where a contact edge of the Schottky contact is formed; said recess of the second part of the transmission line being defined by an ohmic resistance contact edge along the contact between said doped semiconductor area and the transmission line second part; a ratio of a length of said ohmic resistance contact edge to a length of said contact edge of the Schottky contact being significantly greater than 1; and a plurality of said Schottky contacts arranged parallel to one another at right angles to a running direction of the first and second parts of the transmission line and extending substantially over a width of the transmission line whereby a disruption of a characteristic impedance of the transmission line is avoided.

2. The diode of claim 1 wherein the doped semiconductor area is provided on a surface of the substrate.

3. The diode of claim 1 wherein the doped semiconductor area is provided within a portion of the substrate.

4. The diode of claim 1 wherein the doped semiconductor area is in the shape of a rectangular strip aligned transverse to the running direction of the transmission line and wherein one longitudinal edge of the rectangular area is positioned at the Schottky contact.

5. A planar Schottky diode for high cut-off frequency, comprising: a substrate; a conductive transmission line running along a surface of the substrate; a doped semiconductor area having a longitudinal dimension extending at substantially a right angle to a running direction of the transmission line; the transmission line being formed into first and second parts by a break in the transmission line at which a Schottky contact is formed and at which said semiconductor area is positioned; said Schottky contact being formed of a finger-like metal portion extending from the first part of the transmission line at one side of the break and extending into a cut-out portion of the transmission line as a recess at the other side of the break in the second part, the finger-like portion lying in contact with a portion of the doped semiconductor area where a contact edge of the Schottky contact is formed; said recess of the second part of the transmission line being defined by an ohmic resistance contact edge along the contact between said doped semiconductor area and the transmission line second part; a ratio of a length of said ohmic resistance contact edge to a length of said contact edge of the Schottky contact being significantly greater than 1; and wherein a plurality of said Schottky contacts are arranged parallel to one another and distributed substantially over an entire width of the transmission line in a line at right angles to a running direction of the transmission line whereby a disruption of the characteristic impedance of the line is avoided.

* * * * *